United States Patent
Suzuki et al.

(10) Patent No.: US 8,399,913 B2
(45) Date of Patent: Mar. 19, 2013

(54) MONOLITHIC INTEGRATED CIRCUIT

(75) Inventors: Mio Suzuki, Saitama (JP); Akio Iwabuchi, Saitama (JP)

(73) Assignee: Sanken Electric Co., Ltd. (JP)

( * ) Notice: Subject to any disclaimer, the term of this patent is extended or adjusted under 35 U.S.C. 154(b) by 25 days.

(21) Appl. No.: 13/178,988

(22) Filed: Jul. 8, 2011

(65) Prior Publication Data

US 2011/0260777 A1    Oct. 27, 2011

Related U.S. Application Data

(60) Continuation of application No. 12/711,846, filed on Feb. 24, 2010, now Pat. No. 7,999,289, which is a division of application No. 11/694,525, filed on Jan. 5, 2007, now abandoned.

(30) Foreign Application Priority Data

Mar. 31, 2006    (JP) .................................. 2006-098514

(51) Int. Cl.
*H01L 29/778*    (2006.01)

(52) U.S. Cl. ................................. 257/195; 257/E29.246

(58) Field of Classification Search .......................... None
See application file for complete search history.

(56) References Cited

U.S. PATENT DOCUMENTS

| | | | |
|---|---|---|---|
| 5,031,006 A | 7/1991 | Maignant | |
| 5,047,811 A | 9/1991 | Miyano | |
| 5,569,943 A | 10/1996 | Koscica et al. | |
| 6,768,146 B2 | 7/2004 | Yoshida | |
| 2002/0171096 A1 | 11/2002 | Wakejima et al. | |
| 2007/0045765 A1 | 3/2007 | Brar et al. | |
| 2007/0120153 A1 | 5/2007 | Williams et al. | |
| 2007/0228422 A1 | 10/2007 | Suzuki et al. | |
| 2007/0228477 A1 | 10/2007 | Suzuki et al. | |

FOREIGN PATENT DOCUMENTS

| | | |
|---|---|---|
| JP | 2003-229566 | 8/2003 |
| JP | 2005-158889 | 6/2005 |

OTHER PUBLICATIONS

U.S. Appl. No. 11/694,673: Non-Final Office Action, dated Sep. 16, 2008, 10 pages.

*Primary Examiner* — Benjamin Sandvik
(74) *Attorney, Agent, or Firm* — Woodcock Washburn LLP

(57) ABSTRACT

A field-effect semiconductor device such as a HEMT or MESFET is monolithically integrated with a Schottky diode for feedback, regeneration, or protection purposes. The field-effect semiconductor device includes a main semiconductor region having formed thereon a source, a drain, and a gate between the source and the drain. Also formed on the main semiconductor region, preferably between gate and drain, is a Schottky electrode electrically coupled to the source. The Schottky electrode provides a Schottky diode in combination with the main semiconductor region. A current flow is assured from Schottky electrode to drain without interruption by a depletion region expanding from the gate.

4 Claims, 7 Drawing Sheets

MONOLITHIC INTEGRATED CIRCUIT

CROSS REFERENCE TO RELATED APPLICATIONS

This is a continuation of application Ser. No. 12/711,846, filed Feb. 24, 2010 now U.S. Pat. No. 7,999,289, which was a divisional of application Ser. No. 11/694,525, filed Mar. 30, 2007 now abandoned, which claims priority to Japanese Patent Application No. 2006-098514 filed Mar. 31, 2006.

BACKGROUND OF THE INVENTION

This invention relates to monolithic integrated circuits and particularly to a monolithic composite integrated circuit of a field-effect semiconductor device and a Schottky diode. The field-effect semiconductor device may take the form of a metal-semiconductor field-effect transistor (MESFET) or high-electron-mobility transistor (HEMT) among others.

The MESFET and HEMT have both been known and used extensively which are made from semiconducting nitrides. Japanese Unexamined Patent Publication No. 2005-158889 is hereby cited as dealing with these kinds of semiconductor devices.

Let us more closely study the typical prior art construction of the HEMT for example. It comprises an electron transit layer of undoped GaN overlying a silicon substrate via a buffer layer, an electron supply layer of n-type AlGaN on the electron transit layer, and a set of electrodes known as a source, drain and gate on the electron supply layer. The electron transit layer and electron supply layer have a heterojunction therebetween, being made from materials with different band gaps. The piezoelectric and spontaneous depolarization of the heterojunction surfaces creates the familiar two-dimensional electron gas layer as the channel between drain and source. Current flow along this channel is under the control of the voltage bias on the gate.

One of the problems with the HEMT of the above familiar design, as well as with the MESFET or other comparable field-effect semiconductor devices, arose when these devices were connected to an inductive or capacitive load. The drain could then become less in potential than the source, resulting in the application of a reverse voltage to the semiconductor device. A known solution to this problem was the connection of a feedback, regenerative, or protective diode in parallel with the field-effect semiconductor device. This diode had its cathode coupled to the drain, and its anode to the source, of the device. The prior art insulated-gate FET (IGFET) makes use of a parasitic diode for the above purposes. The parasitic diode appears in the form of a p-n junction between the body and drain regions as the source electrode of the IGFET is coupled both to the source region and to the body region surrounding the source region.

However, difficulties have been experienced in applying the parasitic diode technology of the IGFET to the HEMT, MESFET and like field-effect semiconductor devices which make use of the two-dimensional electron gas layer as the channel. Japanese Unexamined Patent Application No. 2003-229566 teaches to provide the required diode (e.g., Schottky diode) lies on that side of the source which is away from the gate, and to connect this diode to the source. The two-dimensional electron gas layer of the field-effect semiconductor device will then be interrupted by the depletion region spreading from the gate when the device is off, so that there will be no current flow between the diode and the drain.

The above difficulties have so far been circumvented by connecting a discrete diode to the field-effect semiconductor devices in question. This makeshift measure is of course objectionable for the extra installation space demanded by the discrete diode and the unnecessarily high manufacturing costs required.

Another problem taken up by the instant invention in regard to the field-effect semiconductor devices under consideration is the difficulty of making them normally off. The HEMT of the usual prior art construction above, for example, was normally on and had to be turned off using a negative power supply for causing the gate to gain a negative potential. Use of such a negative power supply made the associated circuitry unnecessary complex and expensive. The advent of normally-off HEMTs has long been awaited.

The problems and difficulties discussed above are not limited to the field-effect semiconductor devices that utilize the two-dimensional electron gas as the channel. The same discussion is largely applicable to two-dimensional hole gas counterparts of the field-effect semiconductor devices as well.

SUMMARY OF THE INVENTION

The present invention has it as an object to integrally and compactly incorporate a diode for feedback, regeneration or protection purposes with a HEMT, MESFET or like field-effect semiconductor devices without the difficulties encountered heretofore.

Another object of the invention is to attain the first recited object and at the same time make the resulting devices capable of normally-off operation.

Briefly, the invention may be summarized as a monolithic integrated circuit of a field-effect semiconductor device and a Schottky diode. The monolithic integrated circuit includes a main semiconductor region having formed on its major surface a source, a drain, and gate means, with the gate means interposed between the source and the drain. Also included is a Schottky electrode which is formed on the major surface of the main semiconductor region in Schottky contact therewith in order to provide a Schottky diode in combination with the main semiconductor region. The Schottky electrode is positioned away from the source across at least the gate means and electrically coupled to the source.

By "positioned away from the source across at least the gate means" is meant that the Schottky electrode may lie either between the gate means and the drain or even farther away from the gate means than is the drain. A preferred position for the Schottky electrode is between the gate means and the drain.

Such being the construction of the integrated circuit according to the invention, a current flow is assured from the Schottky electrode to the drain without.

TAK-0465 interruption by a depletion region expanding from the gate means. Thus, monolithically incorporated with the field-effect semiconductor device, the Schottky electrode will well serve feedback, regenerative, or protective purposes. The Schottky diode hardly adds to the conventional size of the field-effect semiconductor device, and the monolithic combination of this device and the Schottky diode is significantly less costly than when a discrete diode is combined with the device.

Additional embodiments are disclosed in which a normally-off field-effect semiconductor device, such as that of HEMT- or MESFET-type, is monolithically combined with a Schottky diode. This combination includes a carrier storage overlying the major surface of the main semiconductor region via first insulating means in a position between the source and the drain. The carrier storage is capable of accepting and storing carriers (electrons or holes) to such an extent that the source and the drain are held electrically disconnected from each other even without voltage application to the gate. The gate overlies the carrier storage via second insulating means.

Carrier-enriched by application of an initializer voltage to the gate, the carrier storage functions to shut off the channel (e.g. two-dimensional electron or hole gas layer in the case of a HEMT) through the main semiconductor region by virtue of the field effect. The carrier-enriched carrier storage is just as effective as a biased gate to block the channel. Consequently, the device is held off solely by the carrier-enriched carrier storage, with the gate unbiased; that is, the device is normally off.

The above and other objects, features and advantages of this invention will become more apparent, and the invention itself will best be understood, from a study of the following description and appended claims, with reference had to the attached drawings showing some preferable embodiments of the invention.

DESCRIPTION OF THE EMBODIMENTS

General

Figure 1:
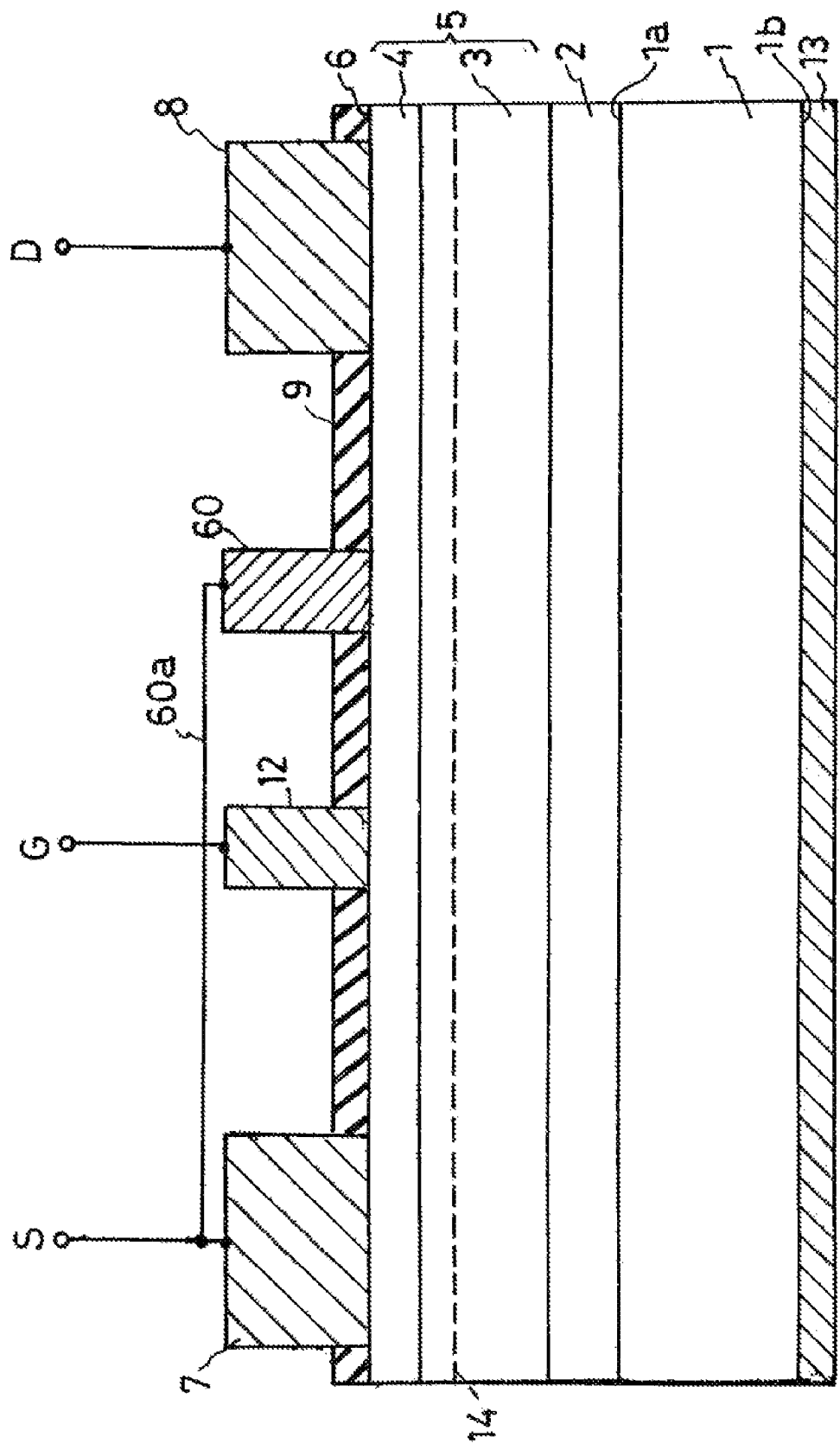
FIG. 1 is a schematic sectional view of a monolithic combination of a HEMT and a Schottky diode built on the novel principles of the present invention.

The present invention will now be described more specifically as embodied in the HEMT/diode combination pictured in FIG. 1 of the drawings as an example of monolithic composite integrated circuits according to the invention. The exemplified HEMT/diode combination comprises a flat substrate 1 of semiconducting monocrystalline silicon having a pair of opposite surfaces $1_a$ and $1_b$. Grown on the first surface $1_a$ of the substrate 1 via a buffer region 2 is a main semiconductor region 5 which is shown constituted of an electron transit layer 3 as a first semiconductor layer and an electron supply layer 4 as a second semiconductor layer according to the conventional HEMT configuration. A source or source electrode 7 and drain or drain electrode 8, both standard HEMT components, are formed in selected positions on a major surface 6 of the main semiconductor region 5, or of the electron supply layer 4. A gate or gate electrode 12, another standard HEMT component, is interposed between source 7 and drain 8 on the main semiconductor region surface 6 in order to control current flow between the electrodes 7 and 8. A back electrode 13 underlies the second surface $1_b$ of the substrate 1.

Also formed on the surface 6 of the main semiconductor region 5, in a position between drain 8 and gate 12, is a diode-creating Schottky electrode 60 constituting a feature of this invention. A conductor $60_a$ electrically connects the Schottky electrode 60 to the source 7. The Schottky diode created by forming the Schottky electrode 60 on the main semiconductor region 5 serves for feedback, regeneration, or protection purposes.

Figure 2:
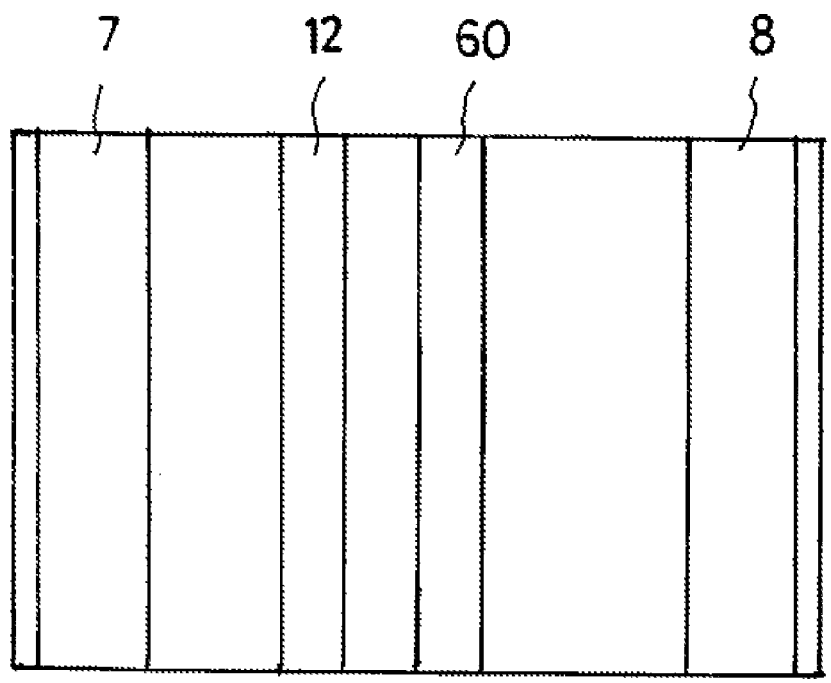
FIG. 2 is a top plan view of the HEMT/diode combination of FIG. 1.

At 9 is seen a protective film of electrically insulating material covering the complete major surface 6 of the main semiconductor region 5. The protective film 9 is windowed to permit all the standard HEMT electrodes 7, 8, 12 and diode-creating Schottky electrode 60 to make direct contact with the main semiconductor region 5. FIG. 2 indicates that all these electrodes 7, 8, 12 and 60 extend in parallel spaced relationship to one another.

Figure 3:
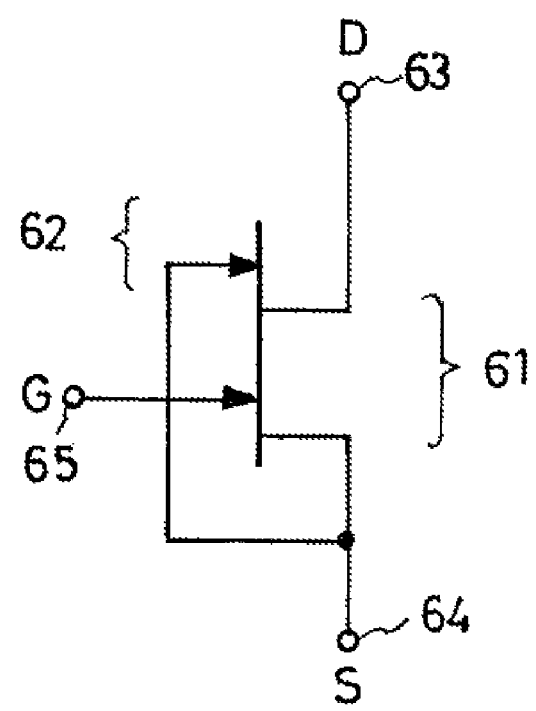
FIG. 3 is an equivalent circuit diagram of the HEMT/diode combination of FIG. 1.

FIG. 3 is an equivalent circuit diagram of the HEMT/diode combination of FIGS. 1 and 2. The HEMT/diode combination is comprised of a HEMT 61 and a Schottky diode 62.

Hereinafter in this specification the above listed substrate 1, buffer region 2, main semiconductor region 5, standard HEMT electrodes 7, 8 and 12, and diode-creating Schottky electrode 60 of the HEMT/diode combination will be detailed in that order and under separate headings. A description of the equivalent circuit HEMT/diode combination will follow the detailed disclosure of the listed components.

Substrate

The substrate 1 serves as both a basis for epitaxially growing the buffer region 2 and main semiconductor region 5 thereon and a mechanical support for these regions. The substrate 1 is made from silicon for economy in this particular embodiment.

Buffer Region

The buffer region 2 may be grown in vapor phase on the substrate 1 by any known or suitable method such as metalorganic chemical vapor deposition (MOCVD) also known as metalorganic vapor phase epitaxy (MOVPE). In practice the buffer region 2 may be either mono- or multi-layered. The multilayer option may comprise, for example, a desired number of alternations of an aluminum nitride (AlN) layer and a gallium nitride (GaN) layer. Other Groups III-V compound semiconductor materials are adoptable. Being not too closely associated with the operation of the HEMT/diode combination, however, the buffer region 2 is eliminable.

Main Semiconductor Region

The main semiconductor region 5 is constituted as aforesaid of the electron transit layer 3 and the electron supply layer 4. Directly overlying the buffer region 2 is the electron transit layer 3 which is made from undoped GaN to a thickness of 1-3 micrometers in this particular embodiment. As indicated by the broken line labeled 14, the electron transit layer 3 provides, in cooperation with the overlying electron supply layer 4 yet to be detailed, a two-dimensional electron gas layer as the channel extending parallel to the surface 6 of the main semiconductor region 5. Groups III-V compound semiconductors other than GaN could be used for the electron transit layer 3.

The electron supply layer 4 is made on the electron transit layer 3 from any of the nitride semiconductors that are generally expressed by the formula:

$$Al_xGa_{1-x}N$$

where the subscript x is a numeral that is greater than zero and less than one, preferably in the range of 0.2 through 0.4, and most desirably 0.3. Although made from undoped AlGaN, the electron supply layer 4 behaves n-like in the completed composite device. Alternately, the electron supply layer 4 may be made from n-doped AlGaN.

The electron supply layer 4 is approximately 5-50 nanometers, preferably 20 nanometers, thick and so is thinner than the electron transit layer 3, so much so that its electric resistance is negligibly small in its thickness direction compared to that in its transverse direction (parallel to the major surface 6 of the main semiconductor region 5). It is understood that the major surface 6 of the electron supply layer is flat, with no special treatment applied in this embodiment.

The electron supply layer 4 is greater in bandgap than the electron transit layer 3, and less in lattice constant than the electron transit layer 3. Piezoelectric depolarization at this heterojunction creates the aforesaid two-dimensional electron gas layer 14 internally of the electron transit layer 3. The two-dimensional electron gas layer 14 indicated by the broken line in FIG. 1 presupposes the "on" state of the device.

Standard HEMT Electrodes

Formed with a prescribed spacing from each other on the major surface 6 of the main semiconductor region 5, the source 7 and drain 8 both make low-resistance contact with the electron supply layer 4. These electrodes 7 and 8 may both be laminations of titanium and aluminum layers.

Placed between source 7 and drain 8, the gate 12 makes Schottky contact with the electron supply layer 4 for controlling current flow between the electrodes 7 and 8. The gate 12 may be either a lamination of nickel and gold layers or a single layer of rhodium.

This particular HEMT is normally on and is to be turned off by making the gate 12 less in potential than the source 7. As the Schottky junction between main semiconductor region 5 and gate 12 is thereby reverse biased, the two-dimensional electron gas layer 14 will be blocked by the depletion region expanding in size from the gate 12 and encroaching upon the layer 14, resulting in nonconduction between source 7 and drain 8. The HEMT may be turned on by either lessening or zeroing the reverse bias on the gate 12. The depletion region will then either shrink or disappear, permitting conduction between source 7 and drain 8.

Diode-Creating Schottky Electrode

Like the gate 12, the Schottky electrode 60 may be either a lamination of nick and gold layers or a single layer of rhodium making Schottky contact with the n-like electron supply layer 4 of the main semiconductor region 5. The Schottky electrode 60 is disposed between drain 8 and gate 12, or on the same side of the gate 12 as the drain 8, in this embodiment. This placement of the Schottky electrode 60 is designed to assure current flow between that electrode and the drain 8 without being interrupted by the depletion region which appears under the gate 12 when the HEMT is off. The Schottky electrode 60 is electrically coupled to the source 7 by way of the conductor $60_a$, so that current flows between Schottky electrode 60 and drain 8 when the source 7 is higher in potential than the drain 8.

Despite the showing of FIG. 1, in which the conductor $60_a$ is depicted highly diagrammatically, it may be held against the insulating film 9. Of course, though, the conductor $60_a$ may extend out of contact with the insulating film 9. The electrodes 7, 8, 12 and 60 are all received in part in windows opened in the insulating film 9, making direct contact with the surface 6 of the main semiconductor region 5.

Equivalent Circuit

As equivalently diagramed in FIG. 3, the HEMT/diode combination of FIGS. 1 and 2 is electrically constituted of the HEMT 61 and Schottky diode 62. The HEMT 61 is shown to have a drain terminal 63, source terminal 64, and gate terminal 65, which correspond respectively to the drain electrode 8, source electrode 7, and gate electrode 12 of FIGS. 1 and 2. The Schottky diode 62 has an anode connected to the source terminal 64, and a cathode connected to the drain terminal 63.

Thus, connected in parallel with the HEMT 61, the Schottky diode 62 serves feedback, regenerative, or protective purposes. For example, when an inductive or capacitive load is connected to the device, the HEMT 61 may be subjected to a reverse overvoltage if the drain terminal 63 grows less in potential than the source terminal 64. The Schottky diode 62 will then conduct by being forward biased, thereby protecting the HEMT 61 from the reverse overvoltage or permitting the flow of a regenerative or feedback current.

The advantages gained by this embodiment of the invention may be recapitulated as follows:

1. The Schottky diode 62 can be monolithically integrated with the HEMT 61 for feedback, regeneration, or protection purposes. Therefore, the Schottky diode 62 hardly adds to the conventional size of the HEMT, and the monolithic combination of this HEMT and the Schottky diode is significantly less costly than when a discrete diode is combined with the HEMT.

2. The drain and gate of the known HEMT were relatively widely spaced from each other in order to assure a sufficient voltage strength therebetween. Placed in this preexisting wide spacing between drain 8 and gate 12, the Schottky electrode 60 makes it unnecessary to increase the conventional size of the HEMT.

3. Upon application of a reverse overvoltage to the HEMT 61, a current flows from Schottky electrode 60 to drain 8 along the low-resistance, high-electron-mobility two-dimensional electron gas layer 14 without being interrupted by the depletion region under the gate 12. The Schottky diode 62 will therefore well serve the purposes for which it is intended.

This embodiment represents an application of the invention to a normally-on HEMT, in which the surface 6 of the main semiconductor region 5 is flat. However, the invention is equally well applicable to a normally-off HEMT in which the surface 6 of the mains semiconductor region 5 is recessed to accommodate the gate 12. It is self-evident that the Schottky electrode 60 can be built into the normally-off HEMT in the same manner as in the case of the normally-on HEMT above.

Figure 4:
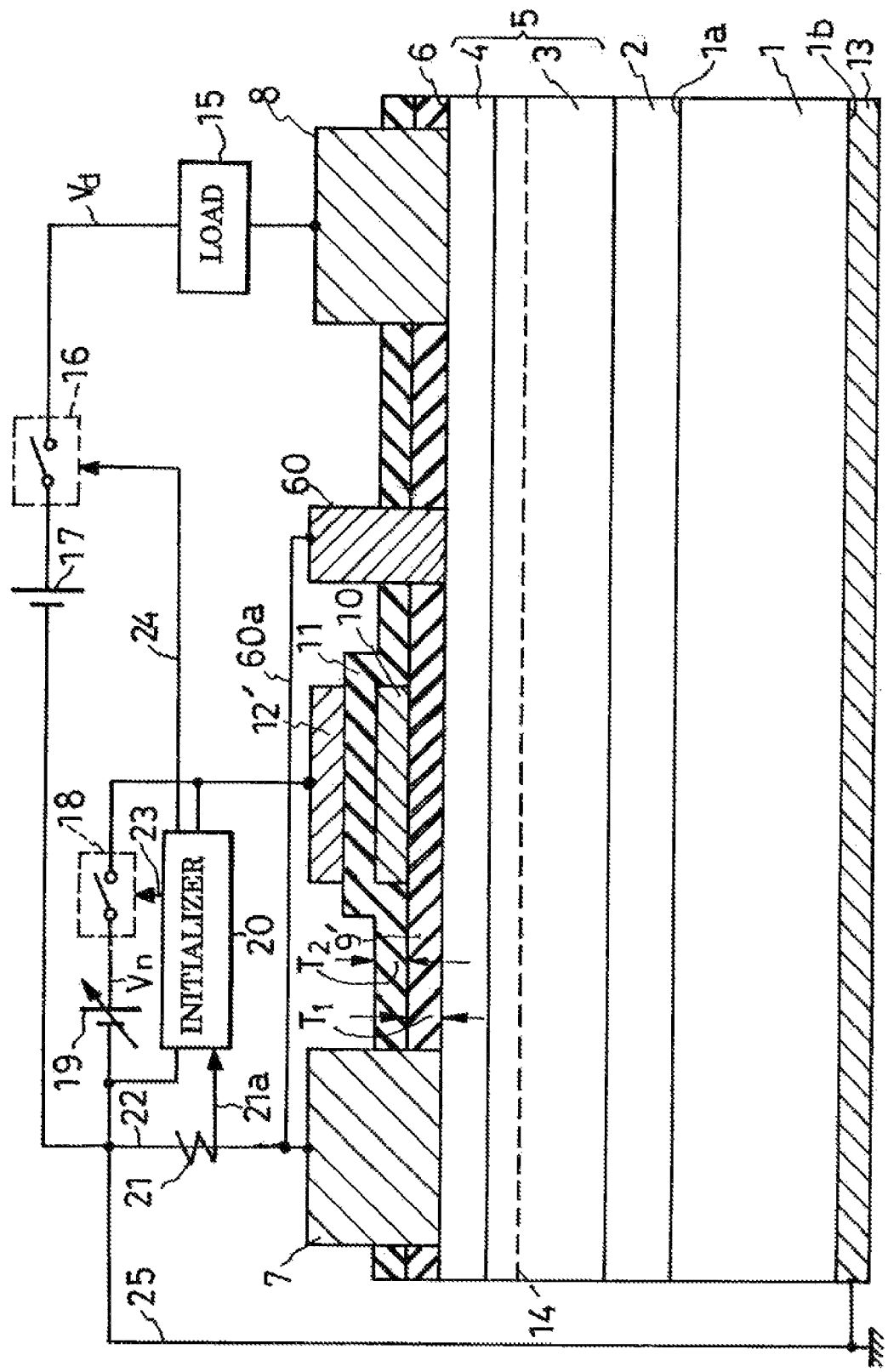
FIG. 4 is a schematic sectional view of a monolithic combination of a normally-off HEMT and a Schottky diode embodying the principles of the invention, shown together with a schematic diagram of associated initialization and power supply circuitry.

Embodiment of FIG. 4

Difficulties have so far been experienced in making HEMTs, MESFETs and like field-effect semiconductor devices that are "normally off." The HEMT, for example, of the known standard construction explained at the beginning of this specification was normally on and had to be turned off using a negative power supply for causing the gate to gain a negative potential. Use of such a negative power supply made the associated circuitry unnecessary complex and expensive. The advent of a normally-off HEMT has long been awaited.

Drawn in FIG. 4 is a monolithic combination of a normally-off HEMT (or "HEMT-type" device, as will be later explained) and a Schottky diode according to the invention. A comparison of FIGS. 1 and 4 will reveal that this normally-off HEMT/diode combination is similar in construction to the normally-on HEMT/diode combination as far as the substrate 1, buffer region 2, main semiconductor region 5, HEMT electrodes 7, 8 and 13, and diode-creating Schottky electrode 60 are concerned. All these components of the normally-off HEMT/diode combination, as well as constituent parts, if any, thereof, are therefore identified in FIG. 4 by the same reference characters as used to denote the corresponding parts in FIGS. 1 and 2.

The normally-off HEMT/diode combination features gating means comprising two insulating films 9' and 11, carrier storage layer 10, and gate 12', in substitution for the insulating film 9 and gate 12 of the FIG. 1 embodiment. The following is a more detailed description of these gating means.

The first insulating film 9', directly overlying the surface 6 of the main semiconductor region 5, has a thickness $T_1$ in the range of 1-100 nanometers, preferably 8-100 nanometers. With its thickness $T_1$ so determined, the first insulating film 9' offers the tunnel effect whereby, upon application of a sufficiently high voltage to the gate 12', the so-called hot electrons that have jumped out of the two-dimensional electron gas layer 14 are allowed through the first insulating film 9' for storage in the carrier storage layer 10. The first insulating film 9' may be made from silicon oxide, as in the form of oxidized polycrystalline silicon (polysilicon), by chemical vapor deposition (CVD). Despite the showing of FIG. 1, being intended to electrically isolate the carrier storage layer 10 from the main semiconductor region 5, the first insulating film 9' need not overlie the entire exposed parts of the main semiconductor region surface 6 but may be disposed only under the carrier storage layer 10.

The carrier storage layer 10 overlies the first insulating film 9' in a position between source 7 and Schottky electrode 60. The carrier storage layer 10 is made from a material, such for example as electroconductive polysilicon, that can accept and store a sufficient amount of carriers for making this HEMT-type device normally off. Being electrically disconnected from all of external circuitry, source 7, drain 8 and gate 12', the carrier storage layer 10 might also be called a floating gate. The carrier storage layer 10 when initialized in a manner yet to be described stores enough carriers for holding the source 7 and drain 8 normally electrically disconnected from each other. Possible alternative materials for the carrier storage layer 10 include metals and crystalline semiconductors and organic semiconductors.

Thoroughly covering the first insulating film 9' and the carrier storage layer 10 thereon is the second insulating film 11 which, like the first insulating film 9', is made from silicon oxide by CVD. The carriage storage layer 10 is thus embedded between the two insulating films 9' and 11. The second insulating film 11 has a thickness $T_2$ in the range of 8-200 nanometers and is preferably thicker than the first insulating film 9'. However, the insulating films 9' and 11 and carrier storage layer 10 should altogether be sufficiently thin to permit the control of the main semiconductor region 5 by the overlying gate 12 in a conventional manner. Again despite the showing of FIG. 1 the second insulating film 11 may cover only the carrier storage layer 10 rather than the entire first insulating film 9' in addition to the carrier storage layer.

The gate 12 overlies the carrier storage layer 10 via the second insulating film 11 and is made from metal such as aluminum. The carrier storage layer 10 and gate 23 need not be of the same size or in exact register with each other as shown but may differ in size or be in partial register. The gate 12 is utilized for carrier-enriching the carrier storage layer 10 at the time of device initialization yet to be detailed, besides being conventionally used for controlling the operation of this device after initialization.

It is now seen that this "HEMT-type device (or normally-off HEMT/diode combination) differs from the conventional HEMT in that the gate 12 is not in direct Schottky contact with the main semiconductor region 5. The device is nevertheless called a HEMT because it utilizes the two-dimensional electron gas layer 14 as the channel.

Figure 8:
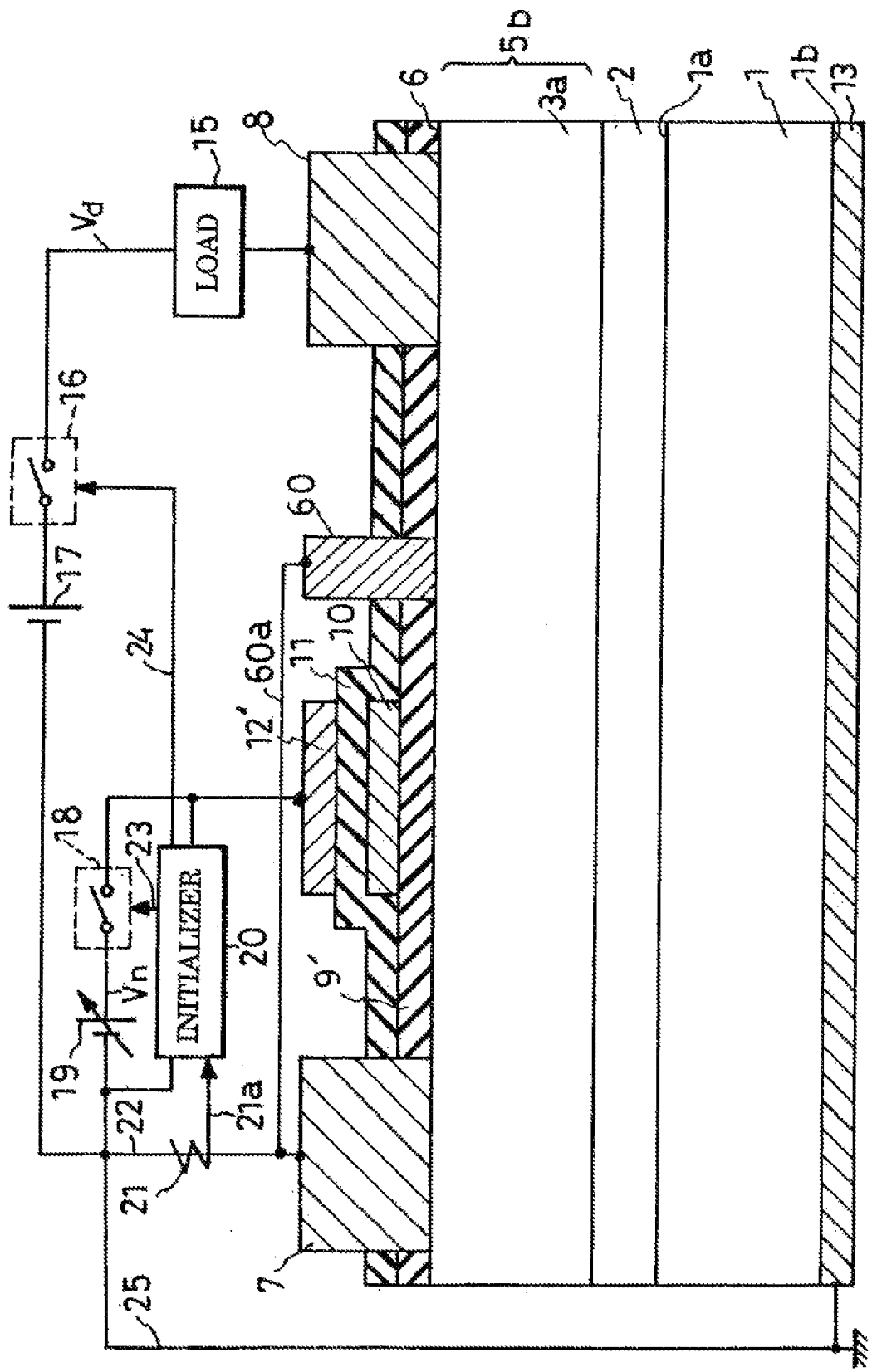
FIG. 8 is also a view similar to FIG. 4 but showing a monolithic combination of a normally-off MESFET and a Schottky diode embodying the invention.
Figure 9:
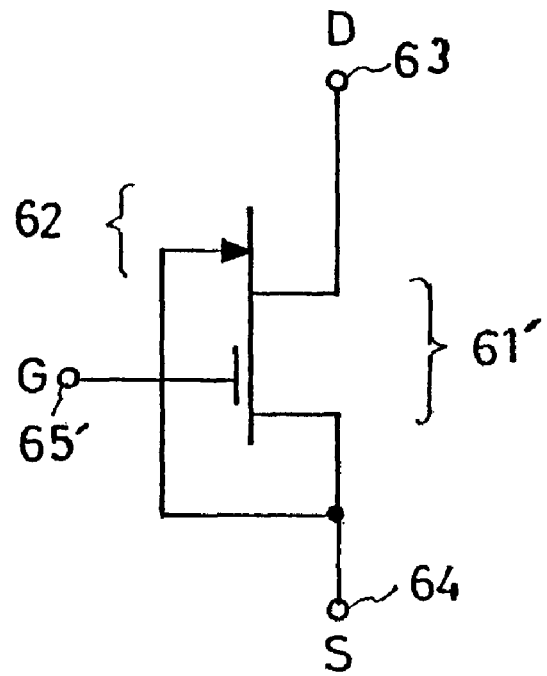
FIG. 9 shows an equivalent circuit diagram of the embodiments of FIGS. 4, 7 and 8.

Reference may briefly had to FIG. 9 for a consideration of the equivalent circuit of this normally-off HEMT/diode combination. (This figure also represents the equivalent circuit of the devices to be described subsequently with reference to FIGS. 7, 8 and 10.) Here is shown a combination of a normally-off HEMT 61' and a Schottky diode 62. The normally-off HEMT 61' has a drain terminal 63, source terminal 64, and gate terminal 65, which correspond respectively to the drain electrode 8, source electrode 7, and gate electrode 12' of the FIG. 4 device. The Schottky diode 62, comprising the Schottky electrode 60, has an anode connected to the source terminal 64, and a cathode connected to the drain terminal 63. Again, connected in parallel with the HEMT 61', the Schottky diode 62 serves feedback, regenerative, or protective purposes.

With reference back to FIG. 4 the normally-off HEMT/diode combination is therein shown in combination with associated power supply and initialization circuitry in order to facilitate the subsequent discussion of how the device is initialized for normally-off operation. A DC power supply 17 is connected between source 7 and drain 8 via a load 15 and drain power switch 16. A gate drive power supply 19 is connected between source 7 and gate 12' via a gate control switch 18. Also connected between source 7 and gate 12' is an initializer circuit 20 which applies to the gate both initializer pulses for carrier enrichment of the carrier storage layer 10 and threshold pulses for checking if a sufficient amount of carriers has been stored in the carrier storage layer in response to each initializer pulse. The initializer circuit 20 is diagramed in detail in FIG. 5, to which reference will be had presently.

In order to aid the initializer circuit 20 in initializing the device, a current detector 21 is connected by way of a conductor $21_a$ to an input of the initializer circuit. Electromagnetically coupled to another conductor 22 which is connected directly to the source 7, the current detector 21 is intended to inform the initializer circuit 20 that a source current has started to flow and hence that the device is turning on. The initializer circuit 20 has an output conductor 23 for on/off control of the gate control switch 18 and another output conductor 24 for on/off control of the drain power switch 16. The source 7 is connected to the back electrode 13 and grounded via a conductor 25 for stabilizing the initialization and subsequent operation of the device.

Figure 5:
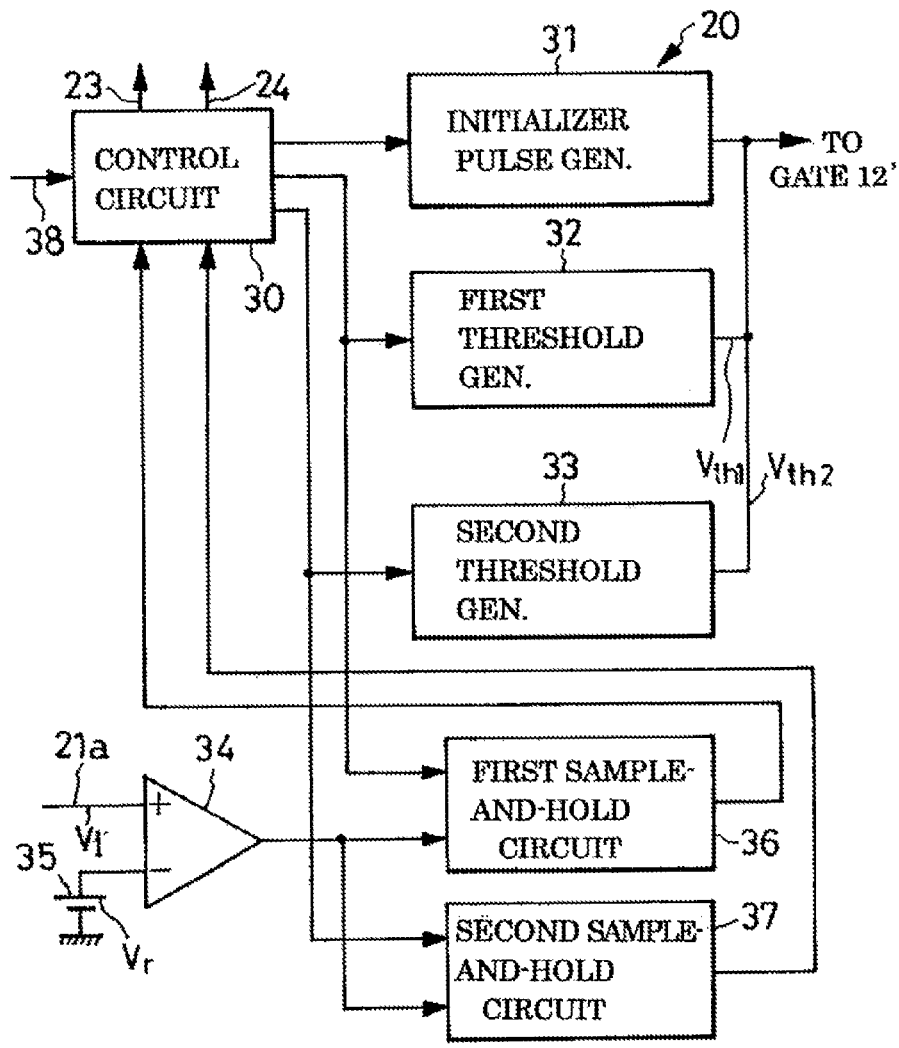
FIG. 5 is a block diagram showing in more detail the initializer circuit included in the initialization and power supply circuitry of FIG. 4.

Reference may now be had to FIG. 5 for a more detailed inspection of the initializer circuit 20. The initializer circuit 20 performs the following functions according to a prescribed initialization program or subroutine:

1. Applying an initializer pulse or voltage between source 7 and gate 12' for causing carriers to be stored in the carrier storage layer 10.

2. Checking the threshold voltage of the device after application of each initializer pulse.

3. Finding if the threshold that has been checked is in a prescribed target range.

4. Readjusting, as necessary, the threshold of the device so as to make it fall within the target range by cyclic repetition of the foregoing three steps.

For the execution of the initialization program the initializer circuit 20 comprises a control circuit 30 having a first output connected to an initializer pulse generator 31, a second output connected to both first threshold generator 32 and first sample-and-hold circuit 36, a third output connected to both second threshold generator 33 and second sample-and-hold circuit 37, a fourth output connected by way of the conductor 23 to the gate control switch 18, FIG. 4, and a fifth output connected by way of the conductor 24 to the drain power switch 16.

Also included is a comparator 34 which has one input connected to the current detector 21, FIG. 4, via the conductor $21_a$, another input connected to a reference voltage source 35, an output connected to both first and second sample-and-hold circuits 36 and 37. The outputs of the initializer pulse generator 31, first threshold generator 32 and second threshold generator 33 are all connected to the gate 12'. The outputs of the first and second sample-and-hold circuits 36 and 37 are both connected to the control circuit 30.

Figure 6:
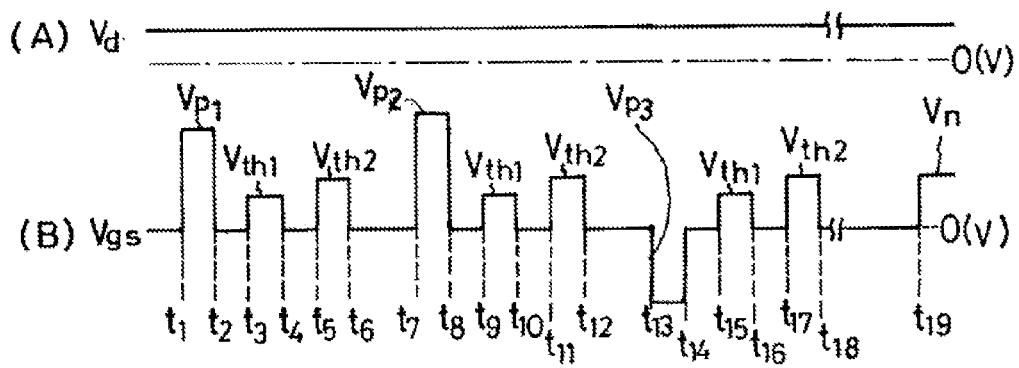
FIG. 6, consisting of (A) and (B), is a diagram of waveforms useful in explaining how the HEMT/diode combination of FIG. 4 is initialized by the initializer circuit of FIG. 5.

The ensuing operational description of the initializer circuit 20 will be better understood by referring also to the waveform diagrams of FIG. 6. The initializer pulse generator 31 operates under the direction of the control circuit 30, generating, during the period of initialization, initializer pulses $V_{p1}$, $V_{p2}$ and $V_{p3}$ each having an amplitude greater than the peak amplitude of the normal gate-source voltage $V_n$ when the device is on. It is understood that the initializer pulse generator 31 is capable of generating pulses of variable amplitude and, additionally, both positive pulses such as those designated $V_{p1}$ and $V_{p2}$ at (B) in FIG. 6 and negative pulses such as that labeled $V_{p3}$ in the same figure.

Referring more specifically to FIG. 6, the normally-off HEMT/diode combination of FIG. 4 is therein shown as being initialized from $t_1$ to $t_{18}$ according to the initialization program and starting normal operation at $t_{19}$. As indicated at (A) in FIG. 6, the voltage $V_d$ of constant magnitude is applied between source 7 and drain 8 from the power supply 17 via the load 15 throughout the periods of initialization and normal operation. At (B) in the same figure are indicated the initializer pulses $V_{p1}$, $V_{p2}$ and $V_{p3}$ from the initializer pulse generator 31 and the threshold pulses $V_{th1}$ and $V_{th2}$ from the threshold generators 32 and 33, as well as the gate control signal $V_n$ during normal operation after $t_{19}$.

Kinetic energy will be imparted to the electrons traveling through the two-dimensional electron gas layer 14 from source 7 toward drain 18 upon application of the initializer pulses $V_{p1}$ and $V_{p2}$, as from $t_1$ to $t_2$ and from $t_7$ to $t_8$ in FIG. 6, between source 7 and gate 12'. These initializer pulses $V_{p1}$ and $V_{p2}$ are greater in amplitude as aforesaid than the gate control signal $V_n$ to be applied to the gate 12' during the normal operation of the device after $t_{19}$. The energized electrons will accelerate to a degree that will grow higher from the source-side extremity of the gate 12' toward its drain-side extremity. Both electrons and holes will be generated upon collision of the accelerating electrons with the atoms in the main semiconductor region 5, FIG. 4, of the normally-off HEMT/diode combination. The high energy electrons thus generated, or hot electrons, will come jumping out from the two-dimensional electron gas layer 14, and some of them will tunnel through the electron supply layer 4 and first insulating film 9', ultimately to be stored in the carrier storage layer 10.

Another explanation is possible for such compulsory electron enrichment of the carrier storage layer 10. The high potential of the gate 12' draws the electrons from the two-dimensional electron gas layer 14 toward the carrier storage layer 10. Then, tunneling through the first insulating film 9', the electrons arrive at the carrier storage layer 10.

Although the second initializer pulse $V_{p2}$ is shown to be of greater amplitude than that of the first $V_{p1}$ at (B) in FIG. 6, this difference is not an absolute requirement for successful initialization of the device. There may be employed, instead, initializer pulses $V_{p1}$ and $V_{p2}$ of the same amplitude.

The electrons that have been stored in the carrier storage layer 10 will mostly stay entrapped therein as long as the relatively low amplitude gate control voltage $V_n$ is being applied between source 7 and gate 12' for turning and holding the device on during normal operation. The electron-impregnated carrier storage layer 10 will create a depletion region in the electron transit layer 3 just as the gate 12' does when biased with a negative voltage. Therefore, even when the gate 12' is unbiased in the normal operation of the device, the electron-rich carrier storage layer 10 will cause the depletion region 3 to appear in the electron transit layer 3, thereby interrupting current flow between source 7 and drain 8. Thus will the HEMT/diode combination operate normally off.

The initialization program may be cut short right after the first initializer pulse $V_{p1}$ if a sufficient amount of electrons is stored in the carrier storage layer 10 in response to this pulse. In practice, however, a sufficient amount of electrons may, or may not, be stored in the carrier storage layer 10 by application of one or more initializer pulses. It is therefore necessary to examine whether the carrier storage layer 10 has been sufficiently electron enriched in response to each initializer pulse. Toward this end the actual threshold of the device is checked after each initializer pulse to see if it is in the target range. It is determinable that a sufficient amount of electrons has been stored in the carrier storage layer 10, that is, that the device has been initialized, if the check reveals that the threshold of the device is in the target range.

As indicated at (B) in FIG. 6, the first threshold generator 32 of the initializer circuit 20 delivers to the gate 12' a first threshold pulse $V_{th1}$ after each of the initializer pulses $V_{p1}$, $V_{p2}$ and $V_{p3}$ under the direction of the control circuit 30. The first threshold pulses $V_{th1}$ are shown applied from $t_3$ to $t_4$, from $t_9$ to $t_{10}$, and from $t_{15}$ to $t_{16}$. These first threshold pulses must of course be appropriately less in amplitude than the positive initializer pulses. The second threshold generator 33 likewise delivers to the gate 12' a second threshold pulse $V_{th2}$ after each first threshold pulse $V_{th1}$ under the direction of the control circuit 30, as from $t_5$ to $t_6$, from $t_{11}$ to $t_{12}$, and from $t_{17}$ to $t_{18}$. The second threshold pulses $V_{th2}$ are less than the initializer pulses, but greater than the first threshold pulses, in amplitude.

The first and the second threshold pulses $V_{th1}$ and $V_{th2}$ represent the lower and upper limits, respectively, of the target range in which the threshold of the normally-off HEMT/diode combination is required to be upon completion of initialization. The amount of carriers stored in the carrier storage layer 10 is adjusted to keep the threshold between the values of the two threshold pulses $V_{th1}$ and $V_{th2}$, so that there will be only minimal fluctuations in the threshold value of all the actual products manufactured according to the present invention. Therefore, upon completion of initialization now being discussed, the HEMT-type device is conditioned for operation with its threshold somewhere between the values represented by the threshold pulses $V_{th1}$ and $V_{th2}$.

Referring back to FIG. 5, the comparator 34 of the initializer circuit 20 has one input connected to the current detector 21, FIG. 4, by way of the conductor $21_a$ and another input connected to the reference voltage source 35. The reference voltage $V_r$ from this source 35 is equal to the voltage of the source (or drain) current at the beginning of each conducting period of the normally-off HEMT/diode combination. Consequently, during the conducting periods of the device, the current detect signal $V_i$ over the conductor $21_a$ is higher than the reference voltage $V_r$. The comparator 34 will then go high, signifying that the device is on. The comparator 34 is low when the device is off because then the current detect signal $V_i$ is less than the reference voltage.

Commanded by the control circuit 30, the first sample-and-hold circuit 36 samples the output from the comparator 34 during, preferably the latter halves of, the periods of $t_3$-$t_4$, $t_9$-$t_{10}$ and $t_{15}$-$t_{16}$ in FIG. 6. The first sample-and-hold circuit 36 holds the comparator output samples and delivers them to the control circuit 30. The second sample-and-hold circuit 37 likewise operates as dictated by the control circuit 30 to sample the output from the comparator 34 during, preferably the latter halves of, the periods of $t_5$-$t_6$, $t_{11}$-$t_{12}$ and $t_{17}$-$t_{18}$. This second set of comparator output samples are also held in the second sample-and-hold circuit 37 and delivered therefrom to the control circuit 30. The samples that have been held in the sample-and-hold circuits 36 and 37 are deleted before the next samplings or before holding of the next samples.

Besides being connected to the initializer pulse generator 31, threshold generators 32 and 33, and sample-and-hold circuits 36 and 37 of the initializer circuit 20, the control circuit 30 is connected to the drain power switch 16, and gate control switch 18 in FIG. 4, for implementation of the initialization program outlined above and detailed below.

First, in response to a call of initialization coming from its unshown source over the conductor 38, the control circuit 30 turns the drain power switch 16 on thereby causing the voltage $V_d$, seen at (A) in FIG. 6, to be applied between source 7 and drain 8 via the load 15. Further the control circuit 30 causes the initializer pulse generator 31 to put out the first initializer pulse $V_{p1}$ from $t_1$ to $t_2$ in FIG. 6. Applied between source 7 and gate 12', the first initializer pulse $V_{p1}$ will cause electrons to be stored in the carrier storage layer 10, either sufficiently or insufficiently.

Then, from $t_3$ to $t_4$, the control circuit 30 causes the first threshold generator 32 to put out the first threshold pulse $V_{th1}$ in the case, represented by FIG. 6, where a sufficient amount of electrons has not been stored in the carrier storage layer 10 by the application of the first initializer pulse $V_{p1}$. The device will therefore turn on upon application of the first threshold pulse $V_{th1}$ to the gate 12'. Thereupon the comparator 34 will go high, indicating that the device is on. The control circuit 30 proceeds to cause the first sample-and-hold circuit 36 to sample and hold the output from the comparator 34 during the $t_3$-$t_4$ period, preferably during its latter half or at $t_4$, and further inputs from this first sample-and-hold circuit a signal indicative of the conduction of the device.

Then the control circuit 30 causes the second threshold generator 33 to put out the second threshold pulse $V_{th2}$ from $t_5$ to $t_6$ for application to the gate 12'. In the case represented by FIG. 6, the device remains on after application of the second threshold pulse $V_{th2}$, as after application of the first threshold pulse $V_{th1}$ from $t_3$ to $t_4$, so that the comparator 34 will remain high. During this $t_5$-$t_6$ period or its second half or at its last moment $t_6$ the control circuit 30 causes the second sample-and-hold circuit 37 to sample and hold the output from the comparator 34 and again inputs from the second sample-and-hold circuit a signal indicating that the device is on. Incidentally, the illustrated two threshold pulses $V_{th1}$ and V of different amplitudes are reversible in sequence.

The control circuit 30 proceeds to determine whether the device has its threshold within the target range. Relied upon to this end are the output from the first sample-and-hold circuit 36 during the $t_3$-$t_4$ period and the output from the second sample-and-hold circuit 37 during the $t_5$-$t_6$ period. It is assumed that these outputs both indicate that the device is on, meaning that the threshold of the device falls short of the target range, in other words, that electrons are still insufficiently stored in the carrier storage layer 10.

Given these findings, the control circuit 30 causes the initializer pulse generator 31 to put out the second initializer pulse $V_{p2}$, which has an amplitude not less than that of the first initializer pulse $V_{p1}$, from $t_7$ to $t_8$. Further, for rechecking the threshold of the device, the control circuit 30 proceeds to cause the threshold generators 32 and 33 to put out another first threshold pulses $V_{th1}$ from $t_9$ to $t_{10}$ and another second threshold pulse $V_{th2}$ from $t_{11}$ to $t_{12}$. If the first sample-and-hold circuit 36 indicates upon application of the first threshold pulse $V_{th1}$ to the gate 12' from $t_9$ to $t_{10}$ that the device is off, and the second sample-and-hold circuit 37 indicates upon application of the second threshold pulse $V_{th2}$ from $t_{11}$ to $t_{12}$ that the device is on, then the control circuit determines that the threshold of the device has now fallen within the target range. Sufficient electrons have been stored in the carrier storage layer 10 to hold the device normally off. Then the initialization program is finished.

Possibly, however, the first sample-and-hold circuit 36 might indicate upon application of the first threshold pulse $V_{th1}$ from $t_9$ to $t_{10}$ that the device was on, and the second sample-and-hold circuit 37 might also indicate upon application of the second threshold pulse $V_{th2}$ from $t_{11}$ to $t_{12}$ that the device was on. The threshold of the device would still be below the target range in that case. Then the control circuit 30 would cause the initializer pulse generator 31 to impress to the gate 12' a third positive initializer pulse, not shown, which has an amplitude not less than that of the second initializer pulse $V_{p2}$. Then the threshold of the device would again be rechecked as after the second initializer pulse $V_{p2}$.

The two sample-and-hold circuits 36 and 37 may both show that the device is off upon application of the threshold pulses $V_{th1}$ and V from $t_9$ to $t_{10}$ and from $t_{11}$ to $t_{12}$, as in the case represented by FIG. 6. These results suggest that more than a sufficient amount of electrons has been stored in the carrier storage layer 10, making it impossible to turn the device on in the target threshold range. Then a negative third initializer pulse $V_{p3}$ is applied to the gate 12', as from $t_{13}$ to $t_{14}$ in FIG. 6, in order that the carrier storage layer 10 may be relieved of excess electrons. The absolute value of the amplitude of this negative initializer pulse $V_{p3}$ is higher than the amplitude of the gate control signal V during the normal operation of the device, as are the amplitudes of the preceding positive initializer pulses $V_{p1}$ and $V_{p2}$.

FIG. 6 shows that the voltage $V_d$ is applied between source 7 and drain 8 via the load 15 during the $t_{13}$-$t_{14}$ period when the negative third initializer pulse $V_{p3}$ is being applied to the gate 12'. Alternatively, however, the drain 8 might be held at the same potential as the source 7.

Upon application of the negative third initializer pulse $V_{p3}$ to the gate 12' as above, some of the electrons that have been stored in the carrier storage layer 10 will be released therefrom and, tunneling back through the first insulating film 9, liberated into the main semiconductor region 5. Then the threshold of the device is rechecked again by the application of one other first threshold pulse $V_{th1}$, as from $t_{15}$ to $t_{16}$, and one other second threshold pulse $V_{th2}$, as from $t_{17}$ to $t_{18}$. The threshold is in the target range if the first sample-and-hold circuit 36 indicates that the device is off, and the second sample-and-hold circuit 37 that the device is on, as a result of these threshold pulses $V_{th1}$ and $V_{th2}$. Then the initialization programs comes to an end. If the threshold is still not in the target range, then the procedure of either $t_{13}$-$t_{18}$ or $t_1$-$t_{18}$ is repeated.

The desired normally-off HEMT/diode combination is obtained upon completion of initialization as at $t_{18}$ in FIG. 6, with its threshold in the target range. It may be put to immediate use by turning on the gate power switch 18 on at $t_{18}$. Then at $t_{19}$ is shown the gate control signal V applied to the gate 12' for turning the device on. It is understood that the amplitude of the gate control signal V is higher than the threshold of the device that has been initialized as above, and less than the amplitudes of the positive initializer pulses $V_{p1}$ and $V_{p2}$. The threshold of the initialized device is intermediate as aforesaid between the amplitudes of the threshold pulses $V_{th1}$ and $V_{th2}$.

The application of the turn-on gate control signal $V_n$ to the gate 12' of the device results in the cancellation of the field due to the electrons that have been stored in the carrier storage layer 10. Thus the two-dimensional electron gas layer 14, which has been held nonconducting by the electrons in the carrier storage layer 10, becomes conducting. The result is the completion of the current path through the source 7, electron supply layer 4, two-dimensional electron gas layer 14, electron supply layer 4, and drain 8.

The device may be turned off by application of a turn-off gate control signal to the gate 12'. The turn-off gate control signal may be either zero or less than the threshold of the initialized device, as from $t_{18}$ to $t_{19}$ in FIG. 6.

This normally-off HEMT/diode combination lends itself to use as a switch. The gate power switch 18 may then take the form of a solid-state switch, and this switch may be turned on and off for on/off control of the device. The magnitude of the drain current is variable by changing the voltage offered by the gate voltage source 19.

The carriers that have been stored in the carrier storage layer 10 will stay there so long that the initializer circuit 20 is removable from the device upon completion of initialization. However, the initializer circuit 20 may be made a permanent appendage of this normally-off HEMT/diode combination if its intended applications require or warrant repeated initializations of the device.

The advantages gained by the above described embodiment of the invention may be recapitulated as follows:

1. The normally-off performance of the device is obtained by the addition of the carrier storage layer 10, with the electron supply layer 4 kept relatively thick and with the electron supply layer made from AlGaN containing a relatively high proportion of aluminum. Consequently, despite being normally off, the device has the two-dimensional electron gas layer 2 of such high electron concentration that its on-resistance is comparatively low.

2. For initialization, carriers are readily stored in the carrier storage layer 10 merely by application to the gate 12' of the initializer pulses which are somewhat higher in amplitude than the gate control signal.

3. The threshold of the device is easily readjustable to the target range, namely, by applying one initializer pulse $V_{p1}$, then by checking the threshold, then, if necessary, by applying either or both of the initializer pulses $V_{p2}$ and $V_{p3}$ of opposite polarities, and then by rechecking the threshold.

4. The device is easily mass-producible with little or no fluctuations in threshold, either when a plurality of devices are fabricated in and on one substrate, when a plurality of discrete units are made, or when a multiplicity of devices are formed in and on one wafer for subsequent dicing.

5. The normally-off HEMT/diode combination incorporates an insulated-gate HEMT which is higher in gate-drain voltage strength than the Schottky-gate HEMT.

Figure 7:
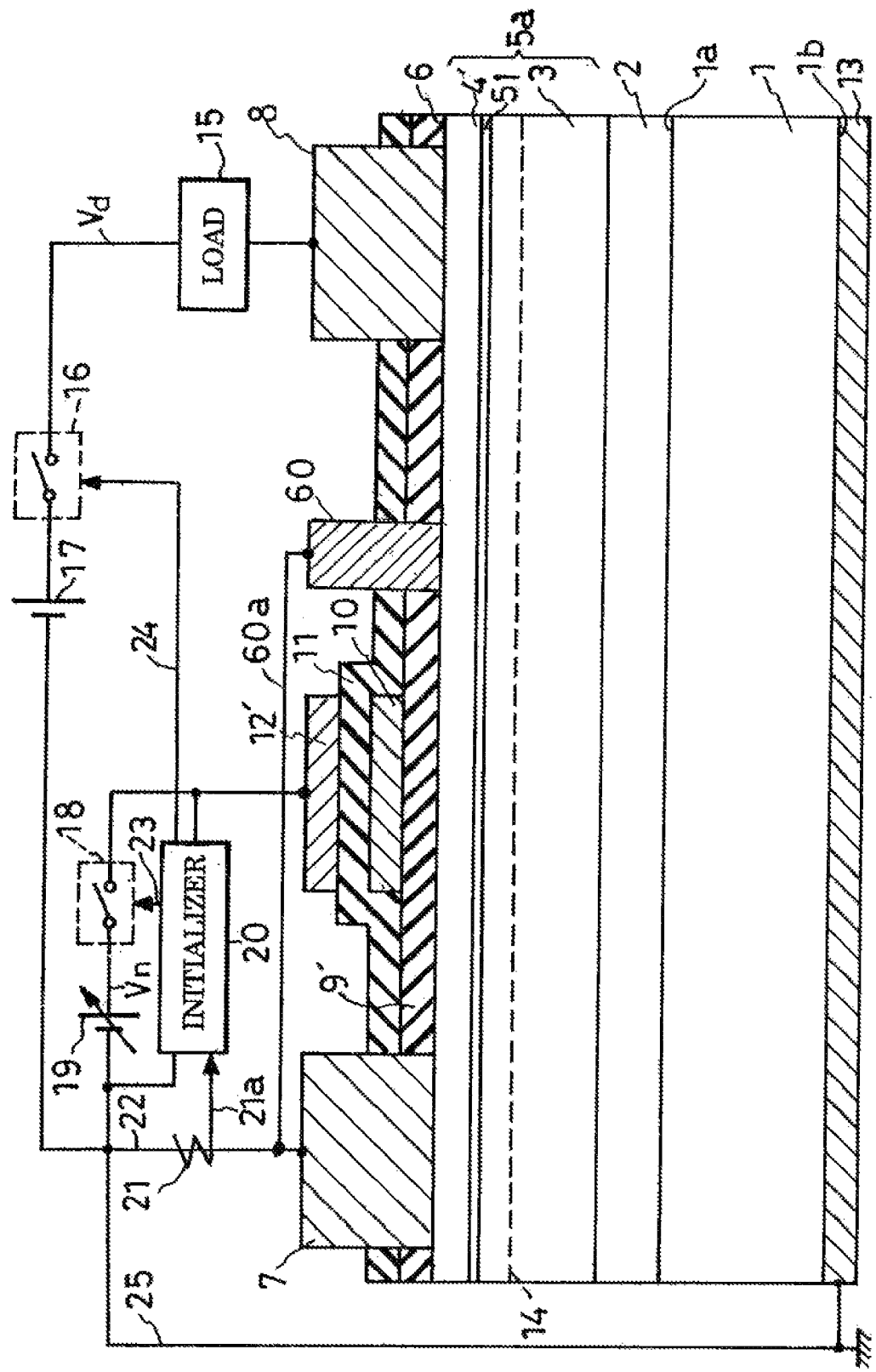
FIG. 7 is a view similar to FIG. 4 but showing another preferred monolithic combination of a normally-off HEMT and a Schottky diode embodying the invention.

Embodiment of FIG. 7

Another normally-off HEMT/diode combination shown here is of the same construction as that of FIG. 4 except for its main semiconductor region $5_a$. The modified main semiconductor region $5_a$ is a lamination of the electron transit layer 3 of the same make as its FIGS. 1 and 4 counterpart 3, a spacer layer 51 of undoped AlGaN, and an n-doped electron supply layer 4'. The electron supply layer 4' differs from its FIGS. 1 and 4 counterpart 4 in that the former is n-doped whereas the latter is undoped and n-like. Formed to a thickness of about 2-5 nanometers between electron transit layer 3 and electron supply layer 4', the spacer layer 51 serves to block impurity diffusion from electron supply layer into electron transit layer. The spacer layer 51 could be made from other III-V compound semiconductors such as AN.

Incorporating the Schottky diode 60, as well as the carrier storage layer 10 together with the associated initializer circuitry, this FIG. 7 embodiment possesses all the additional advantages that have been set forth in connection with the HEMT/diode combination of FIG. 1 and the normally-off HEMT/diode combination of FIG. 4. The teachings of this embodiment are applicable in turn to the foregoing embodiments.

Embodiment of FIG. 8

This embodiment represents an application of the instant invention to a MESFET or MESFET-type field-effect semiconductor device. What has been herein said about similarities and dissimilarities of the conventional HEMT and the inventive HEMT/diode combination of FIG. 4 largely applies here. The typical conventional MESFET has its gate in Schottky contact with the main semiconductor region. The typical conventional IGFET has its gate overlying the main semiconductor region via a gate insulator. The MESFET shown in FIG. 8 differs in its gate placement from either the conventional MESFET or conventional IGFET but closely resembles the conventional MESFET, being the same, except for the features according to the invention, in general configuration and manner of operation. The FIG. 8 device will therefore be called a normally-off MESFET/diode combination.

This normally-off MESFET/diode combination differs from the normally-off HEMT/diode combination of FIG. 4 only in its main semiconductor region $5_b$, which is comprised of only a channel or active layer $3_a$ of silicon-doped n-type GaN. The channel layer $3_a$ directly overlies the buffer layer 2 and is itself overlain by the source 7, drain 8, and Schottky electrode 60. The carrier storage layer 10, gate 12', and insulating films 9' and 11 are all arranged on the surface 6 of the main semiconductor region $5_b$ as in the FIG. 4 embodiment.

Were it not for the carrier storage layer 10, this MESFET/diode combination would operate in normally-on mode. By incorporating the carrier storage layer 10, the device operates normally off as the carrier storage layer on being sufficiently electron enriched is capable of creating a depletion region in the n-GaN channel layer $3_a$ to block current flow between source 7 and drain 8.

How the electrons are introduced into the carrier storage layer 10 is as described above in connection with the FIG. 4 embodiment. Additional advantages of this normally-off MESFET/diode combination are considered self-evident from the foregoing description of the HEMT/diode combination of FIG. 1 and normally-off HEMT/diode combination of FIG. 4. It may also be pointed out that the main semiconductor region 5 of the FIG. 1 embodiment is replaceable by its modification $5_b$ in FIG. 8. That is to say that the Schottky electrode 60 may be incorporated as suggested by this invention in both normally-on and normally-off MESFETs of prior art design.

Figure 10:
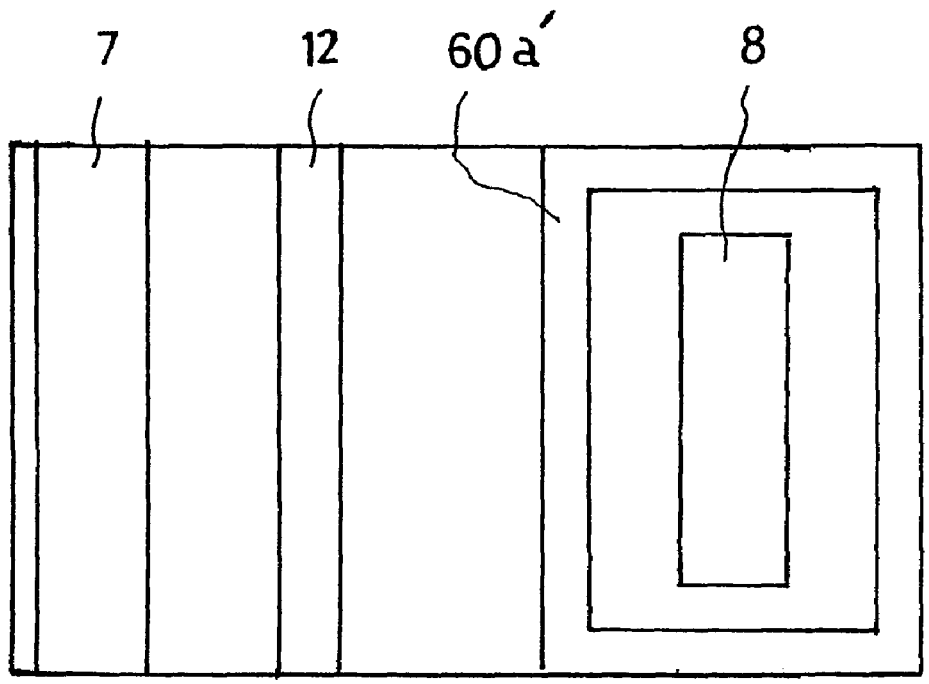
FIG. 10 is a top plan view showing an alternative shape and position of a Schottky electrode on the main semiconductor region according to the position.

Embodiment of FIG. 10

The Schottky electrode according to the invention may take various forms other than that depicted at 60 in FIG. 2. FIG. 10 indicates an alternative Schottky electrode $60_a'$ which is annular in shape, encircling the drain 8 with a spacing therefrom.

The position of the Schottky electrode 60 or $60_a'$ with respect to the other electrodes 7, 8 and 12 (or 12') on the main semiconductor region surface 6 is also variable within the broad teaching hereof. Another possible position for the Schottky electrode 60 or $60_a'$ is on that side of the drain 8 which is farther away from the gate 12 or 12'. In short, broadly, the Schottky electrode according to the invention may be placed anywhere on the drain side of the gate.

Possible Modifications

Notwithstanding the foregoing detailed disclosure it is not desired that the present invention be limited by the exact showings of the drawings or the description thereof. The following is a brief list of possible modifications, alterations or adaptations of the illustrated representative semiconductor devices which are all believed to fall within the purview of the claims annexed hereto:

1. A contact layer could be provided under the source 7 and drain 8 for better ohmic contact with the main semiconductor region 5, $5_a$ or $5_b$ in all the embodiments disclosed herein.

2. The constituent layers 3, $3_a$, 4 and $4_a$ of the main semiconductor region 5, $5_a$ or $5_b$ may be made from III-V compound semiconductors other than GaN and AlGaN, such as InGaN, AlInGaN, AN, InAlN, AlP, GaP, AlInP, GaInP, AlGaP, AlGaAs, GaAs, AlAs, InAs, InP, InN and GaAsP, or from II-VI compound semiconductors such as ZnO, or from other compound semiconductors.

3. The substrate 1 may be made from semiconductors or insulators other than silicon, such as SiC, sapphire, and ceramics.

4. A plurality of composite semiconductor devices according to the invention, comprising either HEMTs or MESFETs, may be fabricated on a single substrate for provision of an inverter or converter circuit or the like.

5. The source 7 and drain 8 could be coupled directly to the electron transit layer 3, instead of to the electron supply layer 4.

6. The electron supply layer 4 could be removed, and there could be provided in its stead an ohmic contact layer, as of an n-type semiconductor, through which the source 7 and drain 8 might be connected to the electron transit layer 3.

7. The electron supply layer 4 of the HEMT/diode combinations of FIGS. 1, 4 and 7 is replaceable by a hole supply layer of a p-type semiconductor. The n-doped GaN channel layer $3_a$ of the MESFET/diode combination of FIG. 8 is likewise replaceable by a p-type semiconductor layer. A two-dimensional hole gas will then be created in what is termed the two-dimensional electron gas layer in the illustrated embodiments, and holes, rather than electrons, will be drawn into the carrier storage layer on initialization.

8. Whether a desired amount of carriers has been stored in the carrier storage layer 10 is ascertainable from a difference between the magnitudes of the current flowing through the source and drain, the current magnitudes being measurable using two current detectors. The carriers that are directed into the carrier storage layer 10 are those which issued from the source 7 but which did not arrive at the drain 8. The amount of the carriers that have issued from the source 7 minus that of the carriers that have arrived at the drain 8 is therefore equal to the amount of the carriers stored in the carrier storage layer 10. It is thus possible to monitor the amount of carriers being stored in the carrier storage layer 10 during the progress of initialization and terminate the initialization program upon storage of a sufficient amount.

9. The carrier storage layer 10 may be carrier enriched by a sustained application of a DC voltage to the gate 12', rather than by the intermittent application of the initializer pulses $V_{p1}$, $V_{p2}$, etc., as in the illustrated embodiments. The DC voltage should be of the mean value of the initializer pulses and higher than the turn-on gate control voltage V in the normal operation of the device.

10. Another alternative method of carrier enrichment for the carrier storage layer 10 is to bombard the same with electrons or protons by the known ion implantation method for storage of electrons or holes.

11. A gate insulator could be interposed between gate 12 and main semiconductor region 5 in the HEMT/diode combination of FIG. 1.

12. The carrier storage layer 10 and insulating films 9 and 11 are all eliminable from the MESFET/diode combination of FIG. 8, with the result that the gate 12' is placed in Schottky contact with the main semiconductor region $5_b$.

13. The gate 12', FIGS. 4, 7 and 8, could be coupled to a field plate on the second insulating film 11.

14. In the same embodiments as above, the insulating films 9' and 11 could be removed from between drain 8 and carrier storage layer 10, and a field plate with an underlying insulator could be provided in their stead.

What is claimed is:

1. A monolithic integrated circuit, comprising:
   (a) a main semiconductor region having a major surface;
   (b) a first main electrode formed on the major surface;
   (c) a second main electrode formed on the major surface, the second main electrode spaced from the first main electrode;
   (d) a Schottky electrode formed on the major surface in Schottky contact therewith, the Schottky electrode interposed between the first main electrode and the second main electrode, spaced from the first main electrode and the second main electrode, and enclosing the second electrode;
   (e) gate means formed on the major surface, the gate means interposed between the first main electrode and the second main electrode and spaced from the first main electrode and the second main electrode;
   (f) a gate control switch electrically connected to the gate means; and
   (g) a gate driver electrically connected to the gate means via the gate control switch.

2. The monolithic integrated circuit as recited in claim 1, wherein the first and the second main electrodes are in contact with the main semiconductor region by low-resistance Ohmic contact.

3. The monolithic integrated circuit as recited in claim 2, wherein the Schottky electrode is electrically coupled to the first main electrode.

4. The monolithic integrated circuit as recited in claim 1, further comprising a current detector for detecting a current flowing through the first main electrode, wherein the gate control switch is controlled by the current detected by the current detector.

* * * * *